(12) United States Patent
Choi (10) Patent No.: US 8,185,070 B2
(45) Date of Patent: May 22, 2012

(54) BROADCAST SYSTEM AND CHANNEL SETTING METHOD USING CENTER AND SEARCHING FREQUENCIES

(75) Inventor: Hyun-Chul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1654 days.

(21) Appl. No.: 11/475,203

(22) Filed: Jun. 27, 2006

(65) Prior Publication Data

US 2007/0060085 A1  Mar. 15, 2007

(30) Foreign Application Priority Data

Sep. 13, 2005 (KR) .............................. 10-2005-85429

(51) Int. Cl.
 *H04B 1/18* (2006.01)
(52) U.S. Cl. ............... 455/161.1; 455/150.1; 455/166.1; 455/177.1; 455/185.1; 370/437; 348/731; 348/732
(58) Field of Classification Search .................. 370/437; 455/161.1, 166.1, 177.1, 185.1, 150.1; 348/732, 348/731
See application file for complete search history.

(56) References Cited

U.S. PATENT DOCUMENTS

| | | | | |
|---|---|---|---|---|
| 3,760,097 A * | 9/1973 | Burroughs et al. | ............ | 380/207 |
| 3,818,353 A * | 6/1974 | Sakamoto | ............ | 325/469 |
| 4,577,226 A * | 3/1986 | Avins | ............ | 348/485 |
| 4,623,926 A * | 11/1986 | Sakamoto | ............ | 348/728 |
| 4,811,021 A * | 3/1989 | Yoshimoto et al. | ............ | 342/361 |
| 5,487,186 A * | 1/1996 | Scarpa | ............ | 455/192.2 |
| 6,297,858 B1 * | 10/2001 | Yang | ............ | 348/731 |
| 6,400,420 B1 * | 6/2002 | Kim | ............ | 348/731 |
| 6,512,555 B1 * | 1/2003 | Patel et al. | ............ | 348/726 |
| 7,283,597 B2 * | 10/2007 | Waltho et al. | ............ | 375/316 |
| 7,359,351 B2 * | 4/2008 | Cho et al. | ............ | 370/329 |
| 7,508,459 B2 * | 3/2009 | Mayer et al. | ............ | 348/731 |
| 2003/0174424 A1 * | 9/2003 | Hart et al. | ............ | 359/889 |
| 2004/0036809 A1 * | 2/2004 | Taniguchi | ............ | 348/731 |
| 2004/0041692 A1 * | 3/2004 | Lyons et al. | ............ | 340/5.64 |

FOREIGN PATENT DOCUMENTS

| | | |
|---|---|---|
| KR | 10-2001-0010177 | 2/2001 |
| KR | 20010010167 A | 2/2001 |
| KR | 10-2003-0048971 | 6/2003 |
| KR | 10-2005-0017870 | 2/2005 |

* cited by examiner

*Primary Examiner* — Rafael Pérez-Gutiérrez
*Assistant Examiner* — Allahyar Kasraian
(74) *Attorney, Agent, or Firm* — H.C. Park & Associates, PLC (57) ABSTRACT

A broadcast system and a channel setting method therein are provided. The broadcast system includes a channel searching unit for setting a center frequency for at least one broadcasting channel, and a searching frequency of n-th and (n+1)-th channels according to each center frequency, and storing channel information obtained from broadcast information received through the n-th or (n+1)-th channel when a broadcast signal is detected at the searching frequency.

15 Claims, 6 Drawing Sheets

BROADCAST SYSTEM AND CHANNEL SETTING METHOD USING CENTER AND SEARCHING FREQUENCIES

CLAIM OF PRIORITY

This application makes reference to, incorporates the same herein, and claims all benefits accruing under 35 U.S.C. §119 from an application for APPARATUS AND METHOD FOR SEARCHING CHANNEL IN BROADCAST SYSTEM filed in the Korean Intellectual Property Office on 13 Sep. 2005 and there duly assigned Ser. No. 10-2005-0085429.

BACKGROUND OF THE INVENTION

1. Field of the Invention

The present invention relates to a broadcast system and a channel setting method therein.

2. Description of the Related Art

A digital or analog broadcast receiving system, such as a cable modem, a digital TV, an analog TV, and a set-top box, receives a broadcast signal which contains channel information or broadcast information (voice or image information) from a head-end or a broadcasting station.

The broadcast system scans a channel containing the received broadcast signal to obtain broadcast information such as terrestrial broadcast information and satellite broadcast information, and channel information, and stores the obtained channel information so that a user can rapidly select a desired channel.

The broadcast system may provide an automatic channel searching function as a supplemental function.

When the automatic channel searching function is initially set up for a user's convenience, the broadcast system scans channel information received from head-ends and broadcasting stations and stores only channel information, i.e., sets channels, corresponding to broadcast information among the scanned channel information.

Then, the broadcast information received through the set channels is provided in response to a channel UP/DOWN key signal received from a remote controller or a previously set button, so that the user can conveniently watch desired broadcasting.

If the broadcast system does not have the automatic channel searching function, the user has to search through all channels using the remote controller or the previously set button in order to select a desired channel.

The user even has to search through channels which do not have broadcast information, which makes the whole process of searching for a desired channel inefficient and inconvenient.

In Korea, head-ends or broadcasting stations are allocated a broadcasting frequency band of from 54 MHz to 864 MHz, each channel containing broadcast information is allocated a frequency bandwidth of 6 MHz, and a broadcast signal is transmitted through each channel having a frequency band of 6 MHz.

Here, there are a total of 135 frequency bands, i.e., 135 channels for broadcast information, and the broadcast information provided from each head-end or broadcasting station is contained in each allocated channel and then transmitted to the broadcast system.

However, because not all channels are used for broadcasting information, searching through channels having no broadcast information should be skipped, only information about channels having broadcast information should be stored, and broadcast information corresponding to channel information set by the user should be provided to the user.

Thus, there is a need to scan broadcast information received from the head-end or the broadcasting station and set only channel information having broadcast information fast and efficiently.

Figure 1:
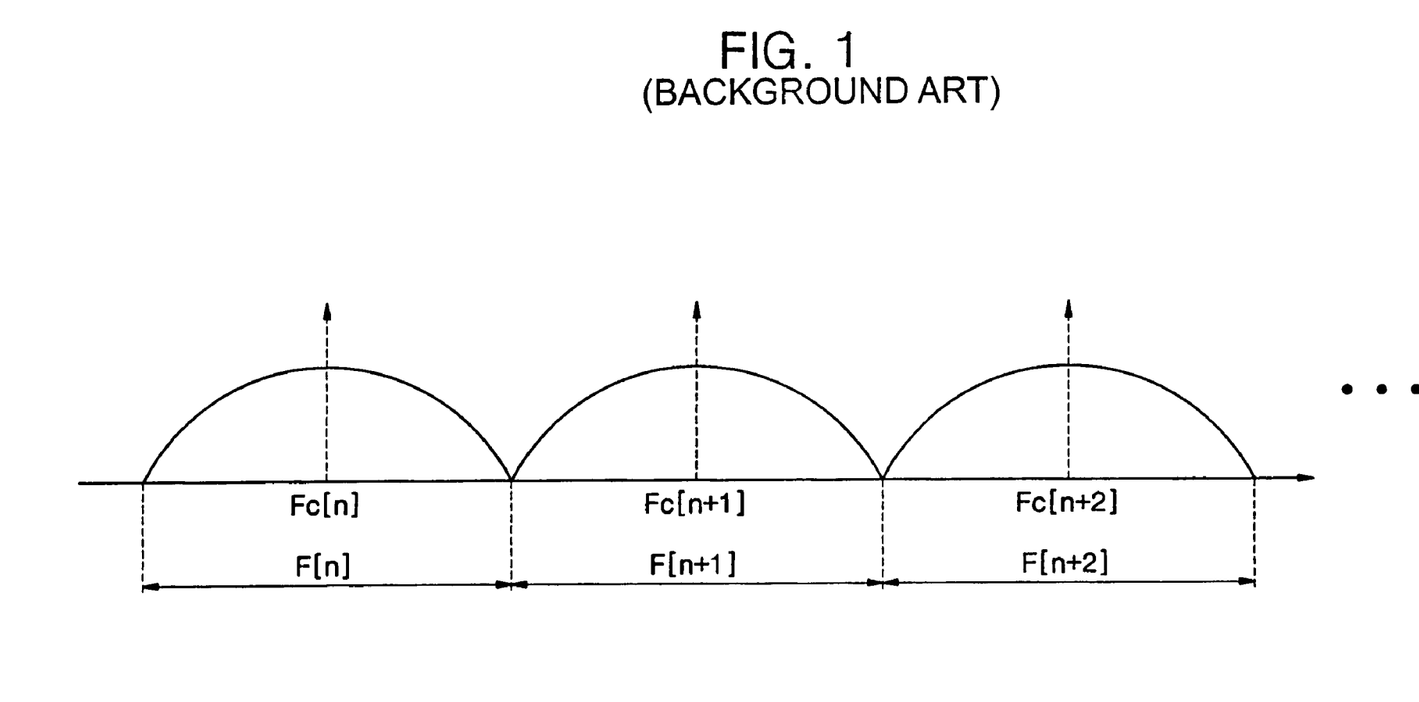
FIG. 1 shows a location of a center frequency to which a tuner is to be locked in a typical broadcast system.

FIG. 1 shows a location of a center frequency to which a tuner is to be locked in a typical broadcast system.

Referring to FIG. 1, an entire broadcasting frequency band has a bandwidth of 54 MHz to 864 MHz, of which each channel F[n] is allocated a bandwidth of 6 MHz, wherein n is the number of a channel and may be less than or equal to 135.

Generally, the tuner of the broadcast system is locked to the center frequency Fc[n] of a 6 MHz channel n and produces an intermediate frequency (IF) broadcast signal corresponding to the center frequency Fc[n].

When the tuner is locked to a certain frequency band, the broadcast system can receive only the signal broadcast over that frequency band.

The tuner transmits the IF broadcast signal to an IF amplifier which amplifies the received broadcast signal by a prescribed level and transmits it to a demodulator which demodulates the received IF broadcast signal.

Channel information is obtained by a demodulation procedure, the demodulator stores the obtained channel information under the control of a controller, and the tuner proceeds to lock to the center frequency Fc[n+1] of the next channel.

In the above-described method, the tuner sequentially locks to each of all 135 channels regardless of whether the channel has broadcast information or not, which is time-consuming and inefficient.

That is, the typical broadcast system employing the automatic channel searching function checks every channel for broadcast information in order to obtain the channel information. Thus, if the time taken to scan one channel is T, the time taken to scan all 135 channels is 135×T.

SUMMARY OF THE INVENTION

It is an objective of the present invention to provide a broadcast system and a channel setting method therein in which a plurality of channels containing a broadcast signal received from a head-end or a broadcasting station are rapidly scanned and set.

According to an aspect of the present invention, there is provided a channel setting method in a broadcast system, comprising: setting a center frequency for at least one broadcasting channel, and a searching frequency of n-th and (n+1)-th channels according to each center frequency; obtaining channel information from broadcast information received through the n-th or (n+1)-th channel when a broadcast signal is detected at the searching frequency; and storing the channel information.

The channel setting method may further comprise increasing the value of n by 2 to select a next searching frequency; and finishing a channel searching procedure when the n-th or (n+1)-th channel corresponding to the selected searching frequency is the last channel.

According to another aspect of the present invention, there is provided a channel setting method in a broadcast system, comprising: setting a center frequency for at least one broadcasting channel, and a searching frequency of n-th and (n+1)-th channels according to each center frequency; storing the searching frequency when a broadcast signal is detected at the searching frequency and selecting a next searching frequency; and storing channel information obtained from the broadcast signal received at the center frequency of the n-th or (n+1)-th channel corresponding to the stored searching frequency when the searching frequency is the last searching frequency.

Selecting the next searching frequency may comprise setting the searching frequency of the n-th and (n+1)-th channels after increasing the value of n by 2.

According to still another aspect of the present invention, there is provided a broadcast system, comprising: a channel searching unit for setting a center frequency for at least one broadcasting channel, and a searching frequency of n-th and (n+1)-th channels according to each center frequency, and storing channel information obtained from broadcast information received through the n-th or (n+1)-th channel when a broadcast signal is detected at the searching frequency.

The channel searching unit may comprise a tuner for converting the broadcast signal received at the searching frequency, which is a middle frequency between the center frequencies of the n-th and (n+1)-th channels, into an IF signal; and an AGC processor for compensating a voltage level of the IF signal; and a controller for comparing the voltage level compensated by the AGC processor to a previously set voltage level to determine whether the broadcast signal exists or not.

According to yet another aspect of the present invention, there is provided a broadcast system, comprising: a channel searching unit for setting a center frequency for at least one broadcasting channel, and a searching frequency of n-th and (n+1)-th channels according to each center frequency, storing the searching frequency when a broadcast signal is detected, and storing channel information obtained from the broadcast signal received at the center frequency of the n-th or (n+1)-th channel corresponding to the stored searching frequency when the searching frequency is the last searching frequency.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. Like numbers refer to like elements throughout the drawings.

Figure 2:
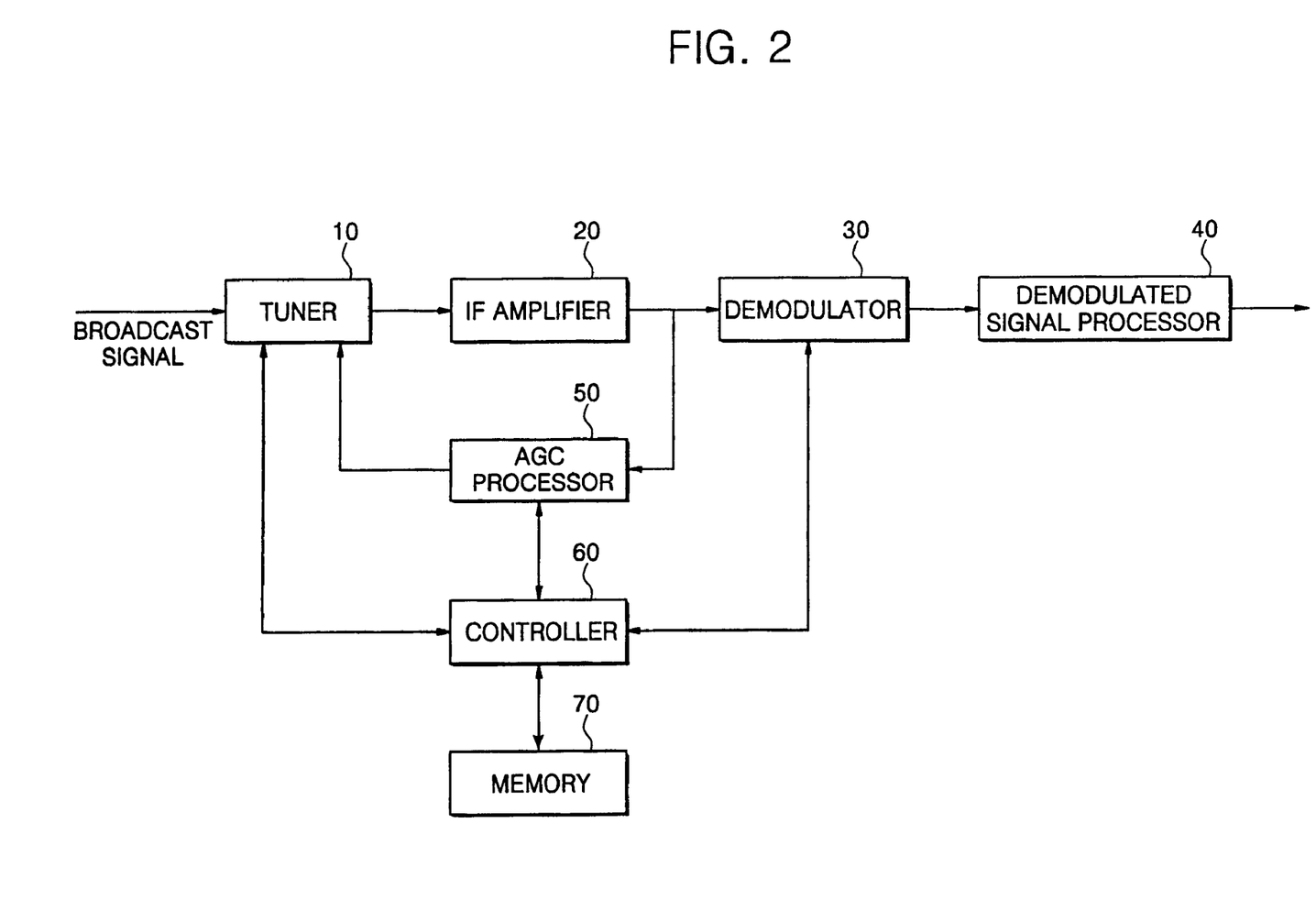
FIG. 2 is a block diagram illustrating a channel searching apparatus of a broadcast system according to an exemplary embodiment of the present invention.

FIG. 2 is a block diagram illustrating a channel searching apparatus of a broadcast system according to an exemplary embodiment of the present invention.

Referring to FIG. 2, the channel searching apparatus includes a tuner 10, an IF amplifier 20, a demodulator 30, a demodulated signal processor 40, an automatic gain control (AGC) processor 50, a controller 60, and a memory 70.

The tuner 10 converts a broadcast signal having a frequency band of 54 MHz to 864 MHz into an intermediate frequency of 44 MHz to produce an IF broadcast signal having broadcast information or channel information, and transmits the IF broadcast signal to the IF amplifier 20.

The IF amplifier 20 amplifies the IF broadcast signal having the broadcast information or the channel information by a predetermined factor, and transmits the amplified IF broadcast signal to the demodulator 30.

The demodulator 30 converts the IF broadcast signal received from the IF amplifier 20 into a digital broadcast signal and transmits the digital broadcast signal to the demodulated signal processor 40.

Here, the demodulator 30 demodulates at least one broadcast signal which is modulated by a quadrature amplitude modulation (QAM) method, an orthogonal frequency division multiplexing (OFDM) method (in case of a terrestrial broadcast signal), or a quadrature phase shift keying (QPSK) method (in case of a satellite signal), and transmits it to the demodulated signal processor 40.

The demodulated signal processor 40 compresses a voice or image signal contained in the demodulated IF broadcast signal received from the demodulator 30 according to the broadcast information using a moving picture experts group (MPEG) technique, and multiplexes programs corresponding to a plurality of channels according to a modulation method corresponding to a transmission medium.

The AGC processor 50 maintains the intensity of the broadcast signal (the amplified IF broadcast signal) tuned by the tuner 10 and then amplified by the IF amplified 20 at a prescribed level so that the demodulator can exactly demodulate the broadcast signal provided from the IF amplifier 20 to the demodulator 30.

Here, the AGC processor 50 compensates for a gain difference between the intensity of a signal fed back from the demodulator 30 and the intensity of a cable signal provided by the tuner 10 to maintain the signal intensity at the predetermined level. That is, the ACG processor 50 compensates the intensity of the broadcast signal transmitted from the tuner 10 to the demodulator 30 with reference to the intensity of the signal fed back from the demodulator 30 to maintain the predetermined signal level.

The controller 60 provides the tuner 10 with a locking control signal having information about a frequency to which the tuner 10 is to be locked.

Figure 3:
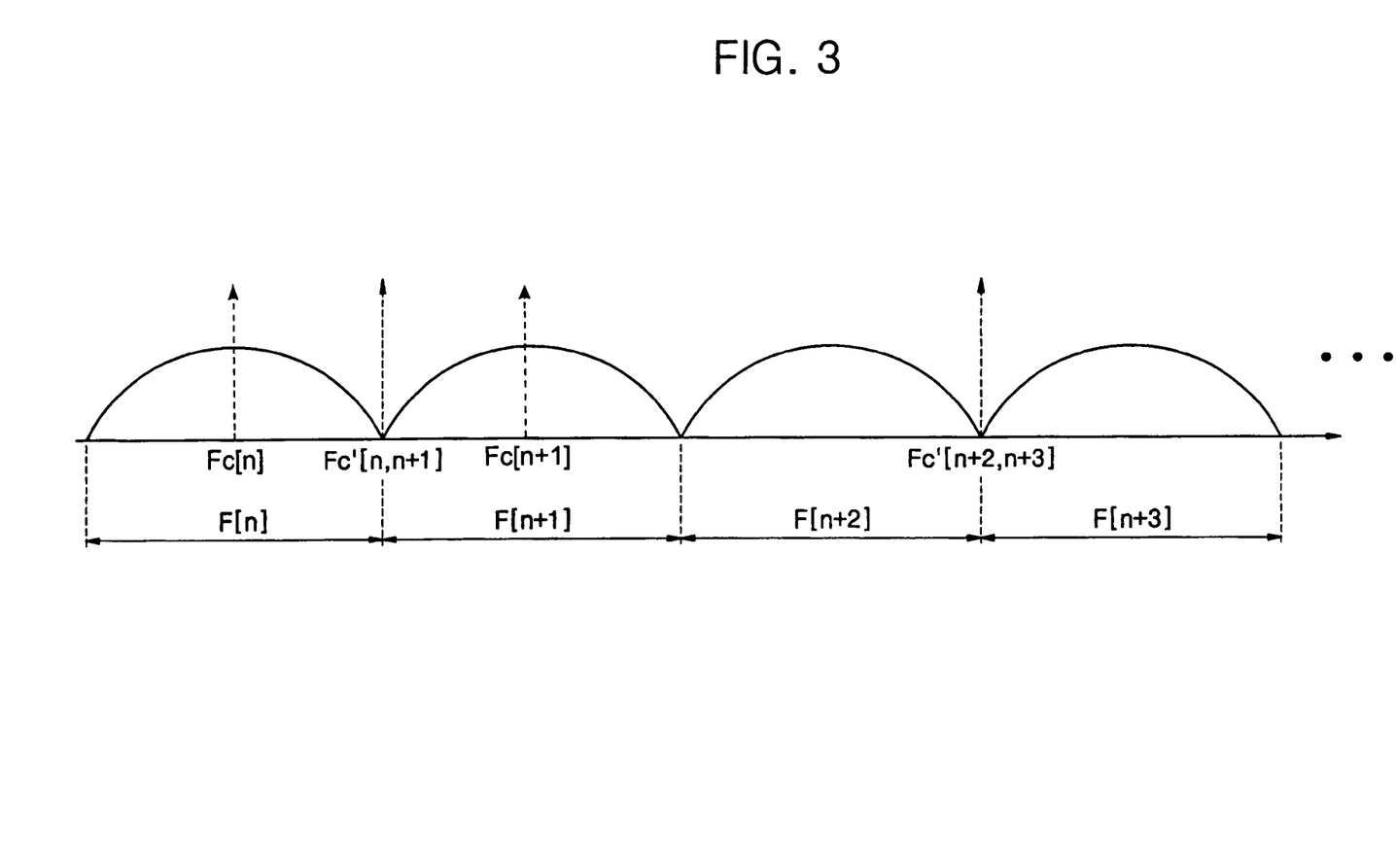
FIG. 3 shows a location of a searching frequency to which a broadcast system is to be locked according to the present invention.

FIG. 3 shows a location of a searching frequency to which the broadcast system is to be locked according to the present invention.

Referring to FIG. 3, a plurality of channels F[n] are allocated a frequency bandwidth of 6 MHz, and Fc[n] and Fc[n+1] are center frequencies corresponding to two channels F[n] and F[n+1], respectively.

In a different manner to what was described with respect to FIG. 1, FIG. 3 shows a searching frequency Fc'[n,n+1] to which the tuner 10 is to be locked is located at a middle portion between the center frequency Fc[n] of the n-th channel F[n] and the center frequency Fc[n+1] of the (n+1)-th channel F[n+1].

That is, the searching frequency Fc'[n,n+1] is located at the boundary between the two adjacent channels F[n] and F[n+1].

For example, a frequency band of 54 MHz to 864 MHz is used as the broadcasting frequency band in Korea, of which a frequency bandwidth of 6 MHz is allocated per channel.

Accordingly, the channel F[n] is allocated the frequency band from 54 MHz to 60 MHz and the channel F[n+1] is allocated the frequency band from 60 MHz to 66 MHz.

The center frequency Fc[n] of the channel F[n] is 57 MHz, the center frequency Fc[n+1] of the channel F[n+1] is 63 MHz.

Thus, the searching frequency Fc'[n,n+1] to which the tuner 10 is to be locked is 60 MHz.

The controller 60 controls the compression and multiplexing of the voice or image signal contained in the broadcast signal based on the MPEG technique performed by the demodulated signal processor 40.

The controller 60 compares an AGC output value to a previously set signal level to determine whether a channel has broadcast information or not, and stores the channel information of a channel having broadcast information in the memory 70.

The memory 70 stores broadcast information of the whole frequency band or channel information corresponding to broadcast information received from the controller 60.

Figure 4:
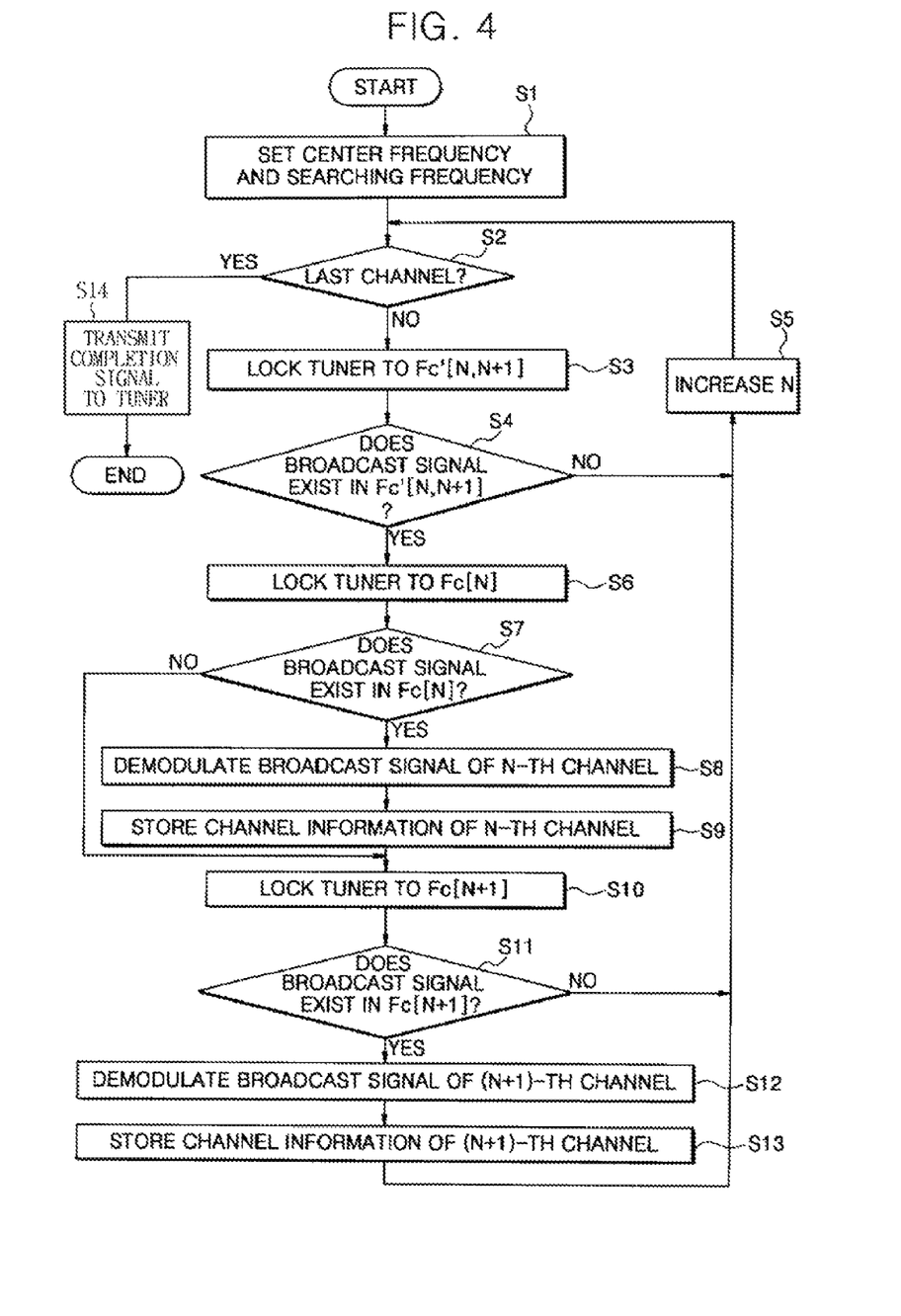
FIG. 4 is a flowchart illustrating a channel searching procedure in a broadcast system according to an exemplary embodiment of the present invention.

FIG. 4 is a flowchart illustrating a channel searching procedure in a broadcast system according to an exemplary embodiment of the present invention.

Referring to FIG. 4, the controller 60 of the broadcast system sets the searching frequency and the center frequency which are used for locking of the tuner 10 and stores the searching frequency and the center frequency in the memory 70 (S1).

Also, the controller 60 determines whether a corresponding channel is the last channel to lock the tuner 10 to, and transmits a locking completion signal to the tuner 10 (S14) when the corresponding channel is the last channel to which the tuner 10 is to be locked.

However, when the corresponding channel is not the last channel to which the tuner 10 is to be locked, the controller 60 transmits a locking control signal to the tuner 10 causing the tuner 10 to be locked to the searching frequency Fc'[n,n+1] at the boundary between the center frequencies Fc[n] and Fc[n+1] of two successive channels (S3).

Next, it is determined whether a broadcast signal containing broadcast information or channel information is received through the channels F[n] and F[n+1] corresponding to the searching frequency Fc['n,n+1] (S4). When a broadcast signal is received, the tuner 10 converts the frequency of the broadcast signal into the IF and transmits it to the IF amplifier 20.

However, when no such broadcast signal is received, the tuner 10 converts very weak noise into the IF and transmits it to the IF amplifier 20.

The IF amplifier 20 then amplifies the IF broadcast signal by a prescribed level and transmits it to the demodulator 30.

When the amplified IF broadcast signal is transmitted from the IF amplifier 20, the AGC processor 50 compensates the amplified IF broadcast signal by a prescribed signal level according to the control signal of the controller 60 so that the demodulator 60 can exactly demodulate it.

However, when the amplified IF broadcast signal is not received from the IF amplifier 20, the AGC processor 50 can not compensate it by a prescribed signal level since there is no input signal of the demodulator 30, and thus the AGC output value does not reach the previously set signal level.

Here, the previously set signal level serves as a reference value to determine whether the broadcast signal is contained in a certain channel or not.

When the AGC output value received from the AGC processor 50 does not reach the previously set signal level, the controller 60 recognizes that there is no broadcast signal in the two channels F[n] and F[n+1] corresponding to the searching frequency Fc'[n,n+1], and increases the value of n by 2 before transmitting the locking control signal for the searching frequency of the two channels (i.e., Fc'[n+2,n+3] of the two channels F[n+2] and F[n+3] shown in FIG. 3) to the tuner 10 (S5).

For example, when the searching frequency to which the tuner 10 is to be locked is Fc'[1,2], if the AGC processor 50 can not obtain an AGC output value of more than a prescribed signal level, the channels F[n] and F[n+1] are determined not to contain the broadcast signal.

That is, it is checked by one time locking of the tuner 10 whether the broadcast signal is contained in the two channels F[n] and F[n+1] or not.

When an AGC output value of more than the prescribed signal level is received from the AGC controller 50, the controller 60 recognizes that the broadcast signal exists in one or both of channels F[n] and F[n+1] corresponding to the searching frequency Fc'[n,n+1].

Then, the controller 60 transmits the locking signals for the channels F[n] and F[n+1], beginning with the locking signal for the channel F[n]. The tuner 10 receives the locking signal from the controller 60 to lock itself to the center frequency Fc[n] of the channel F[n] (S6).

Then, the tuner 10 converts the broadcast signal received through the channel F[n] into the IF to produce the IF broadcast signal, and transmits the IF broadcast signal to the IF amplifier 20. The IF amplifier 20 amplifies the IF broadcast signal by a prescribed level and transmits it to the demodulator 30. The AGC processor 50 maintains the IF broadcast signal at a previously set voltage level which the demodulator 30 can exactly demodulate. Then controller 60 determines whether the broadcast signal exists in the channel F[n] when the AGC output value is more than a prescribed level (S7).

Thus, the controller 60 transmits a demodulation control signal to the demodulator 30, and the demodulator 30 demodulates the received broadcast signal according to the demodulation control signal to thereby produce the channel information (S8).

The controller 60 then stores the channel information of the channel F[n] in the memory 70 (S9).

Subsequently, the controller 60 transmits to the tuner 10 the locking control signal for the center frequency Fc[n+1] of the next subsequent channel F[n+1] which is located adjacent to the channel F[n]. The tuner 10 locks to the center frequency Fc[n+1] of the channel F[n+1] according to the locking control signal received from the controller 60 (S10), and receives the broadcast signal containing the broadcast information or the channel information through the channel F[n+1].

Then, the tuner 10 converts the broadcast signal received through the channel F[n+1] into the IF to produce the IF broadcast signal, and transmits the IF broadcast signal to the IF amplifier 20. The IF amplifier 20 amplifies the IF broadcast signal by a prescribed level and transmits it to the demodulator 30. The AGC processor 50 maintains the IF broadcast signal at a previously set voltage level which the demodulator 30 can exactly demodulate. Then controller 60 determines whether the broadcast signal exists in the channel F[n+1] when the AGC output value is more than a prescribed level (S11), converts the frequency of the broadcast signal into the IF, and transmits it to the IF amplifier 20.

When the AGC output value is more than the prescribed level, the controller 60 determines that the broadcast signal exists in the channel F[n+1] and controls the demodulator 30 to demodulate the broadcast signal (S12) to produce the channel information and store the channel information in the memory 70 (S13).

The controller 60 then increases the value of n by 2 (S5) and transmits the locking control signal for the searching frequency of the next two channels to the tuner 10.

Meanwhile, when the AGC output value does not reach the prescribed level in step S11, the controller 60 determines there is no broadcast signal in the channel F[n+1] and increases the value of n by 2, and transmits the locking control signal for the searching frequency of the next two channels to the tuner 10 (S5).

Figure 5A:
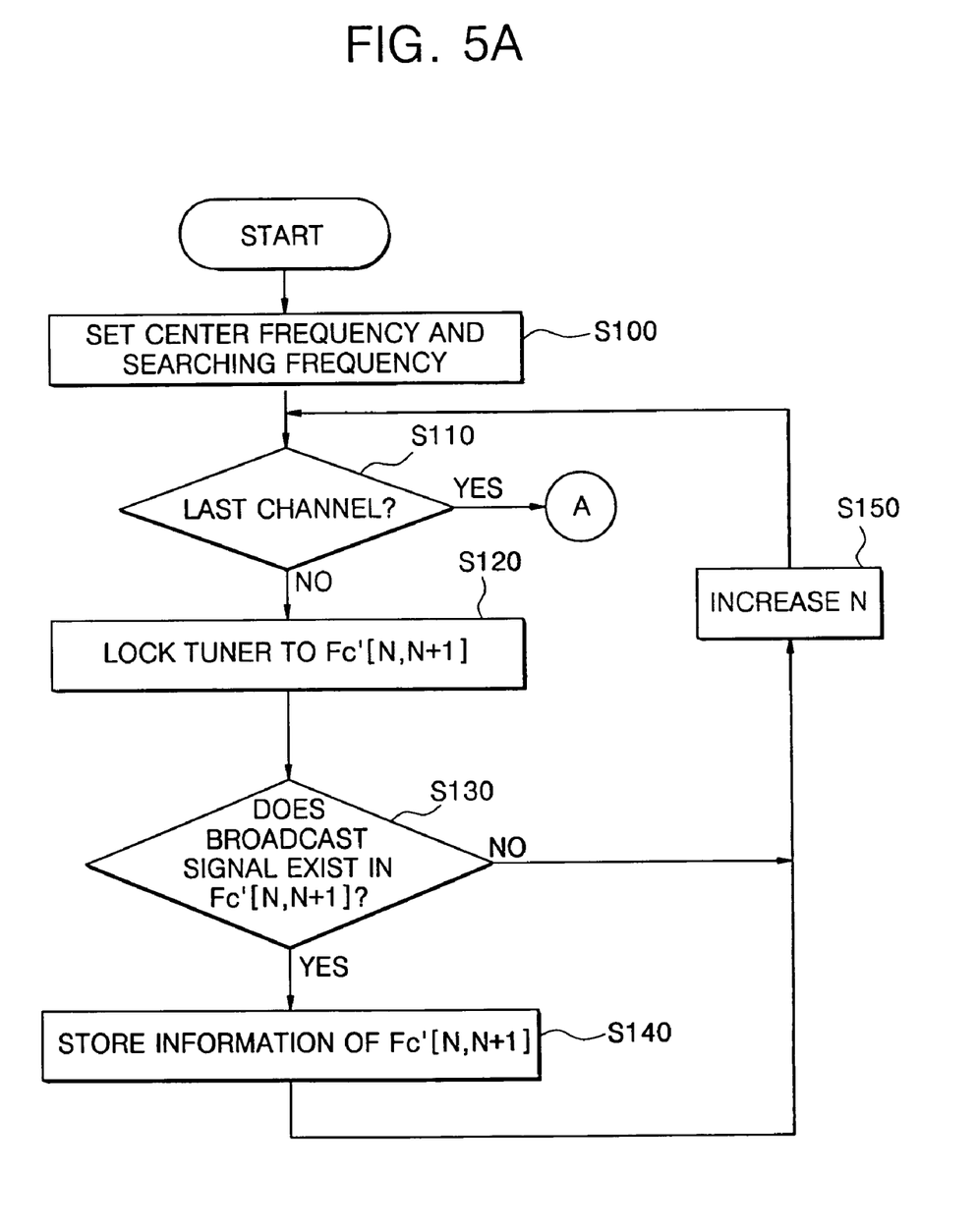
FIGS. 5A and 5B are flowcharts illustrating a channel searching procedure in a broadcast system according to another exemplary embodiment of the present invention.
Figure 5B:
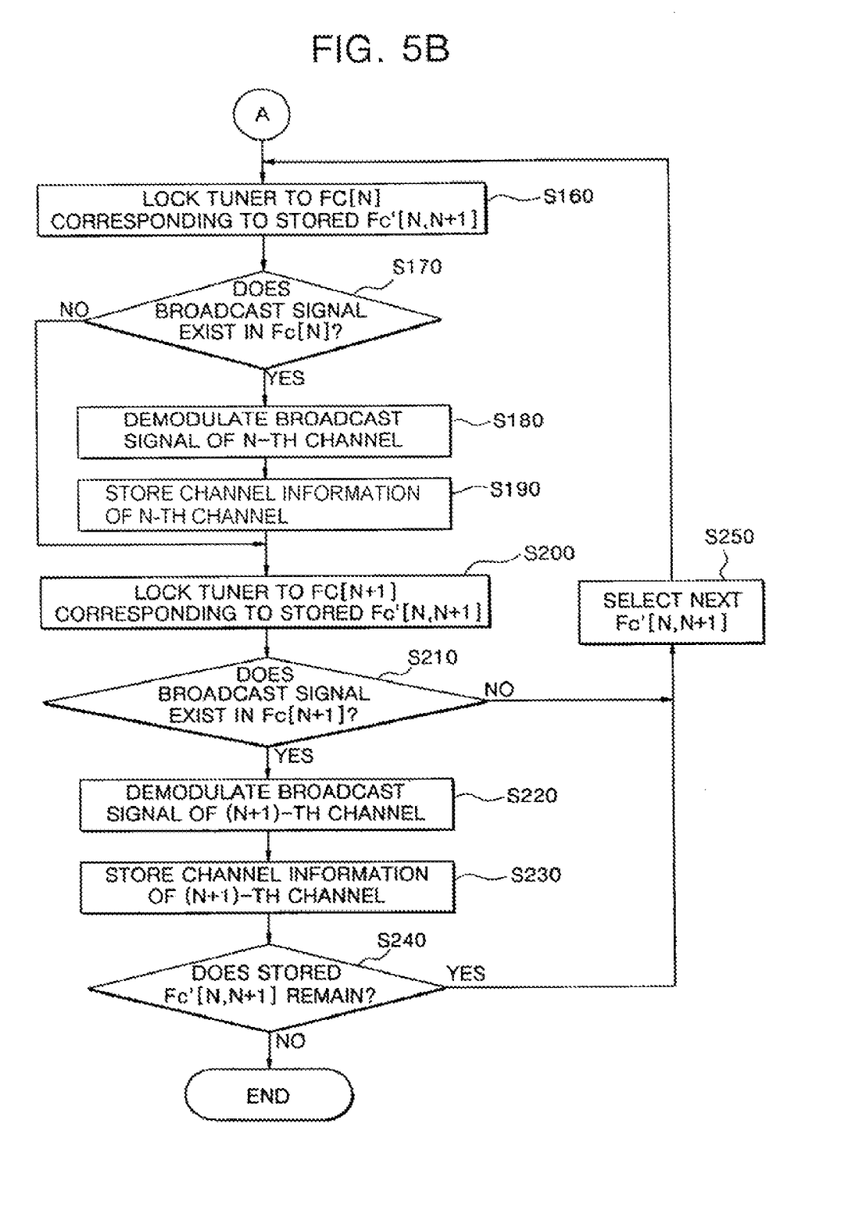

FIGS. 5A and 5B are flowcharts illustrating a channel searching procedure in a broadcast system according to another exemplary embodiment of the present invention.

Referring to FIG. 5A, the controller 60 of the broadcast system sets the searching frequency and the center frequency to which the tuner 10 is locked and stores the searching frequency and the center frequency in the memory 70 (S100).

Also, the controller 60 transmits the locking control signal containing information about the boundary frequency to which the tuner 10 is to be locked so that the tuner 10 can be sequentially locked to the stored searching frequency.

Specifically, the controller 60 determines whether a corresponding channel is the last channel to which the tuner 10 is to be locked (S110), and transmits a locking control signal for the searching frequency channel Fc'[n.n+1] of the two channels F[n] and F[n+1] to the tuner 10 when the corresponding channel is the last channel to which the tuner 10 is to be locked.

The tuner 10 is locked to the searching frequency Fc'[n,n+1] according to the received locking signal (S120), and converts the frequency of the received broadcast signal into the IF and transmits it to the IF amplifier 20 when the broadcast signal containing broadcast information or channel information exists in the channel corresponding to the boundary frequency Fc'[n,n+1] (S130).

The IF amplifier 20 amplifies the received IF broadcast signal by a prescribed level and transmits it to the demodulator 30.

At this time, the AGC processor 50 maintains the prescribed level so that the demodulator 30 can exactly demodulate the IF broadcast signal transmitted from the IF amplifier 20 to the demodulator 40.

The controller 60 stores the channel information of the channels F[n] and F[n+1] corresponding to the searching frequency Fc'[n,n+1] in the memory 70 when the AGC output value is more than a prescribed level (S140).

However, when the AGC output value received from the AGC processor 50 does not reach the prescribed level, that is, the broadcast signal does not exist in the channels F[n] and F[n+1], the controller 60 increase the value of n and transmits the locking control signal for the searching frequency of the next two channels to the tuner 10 (S150).

As shown in FIG. 5B, the controller 60 transmits the locking control signal to the tuner 10 in the stored order of the center frequency information, when it is determined in step S110 that the center frequency information containing the channel information is completely stored, so that the tuner 10 locks to the channel corresponding to the locking control signal based on the stored center frequency information (S160).

For example, when the stored center frequency information is Fc'[5,6] in the memory 70, the controller 60 transmits to the tuner 10 the locking control signal for the center frequencies Fc[5] of the channel F[5] corresponding to the searching frequency Fc'[5,6]. Accordingly, the tuner 10 locks to the center frequencies Fc[5] and it is determined (S170) whether a broadcast information or the channel information exists in the channel F[5] corresponding to the locked center frequency Fc[5].

When it is determined in step S170 that the broadcast signal containing the broadcast information or the channel information exists in the channel F[n] corresponding to the locked center frequency Fc[n], the tuner 10 converts the frequency of the broadcast signal into the IF and transmits it to the IF amplifier 20.

The IF amplifier 20 then amplifies the received IF broadcast signal by a prescribed level and transmits it to the demodulator 30.

At this time, the AGC processor 50 maintains a prescribed level for the demodulator 30 to exactly demodulate the IF broadcast signal received from the IF amplifier 20.

When the AGC output value is more than a prescribed level, that is, when the broadcast signal exists in the channel F[n] (S170), the controller 60 controls the demodulator 30 to demodulate the broadcast signal (S180) to produce the channel information and store the channel information in the memory 70 (S190).

The controller 60 then transmits the locking control signal for the center frequency Fc[n+1] to the tuner 10, causing the tuner 10 to lock to the center frequency Fc[n+1] of the channel F[n+1] (S200).

Additionally, when it is determined in step S170 that the broadcast signal does not exist in the channel F[n], the controller 60 transmits to the tuner 10 the locking control signal for the center frequency Fc[n+1] of the channel F[n+1], causing the tuner 10 to lock to the center frequency Fc[n+1] of the channel F[n+1] (S200).

When the broadcast signal containing the broadcast information or the channel information is received through the locked channel, the tuner 10 converts the frequency of the broadcast signal into the IF and transmits it to the IF amplifier 20.

The IF amplifier 20 amplifies the received IF broadcast signal by a prescribed level and transmits it to the demodulator 30.

At this time, the AGC processor 50 maintains a prescribed level for the demodulator 30 to exactly demodulate the IF broadcast signal received from the IF amplifier 20.

When the AGC output value is more than the prescribed level, that is, when the broadcast signal exists in the channel F[n+1] (S210), the controller 60 controls the demodulator 30 to demodulate the broadcast signal (S220) to produce the channel and stores the channel information in the memory 70 (S230).

For example, when the stored center frequency information is Fc'[5,6] in the memory 70, the controller 60 transmits to the tuner 10 the locking control signal for the center frequencies Fc[6] of the channel F[6] corresponding to the searching frequency Fc'[5,6]. Accordingly, the tuner 10 locks to the center frequencies Fc[6] and it is determined (S210) whether a broadcast information or the channel information exists in the channel F[6] corresponding to the locked center frequency Fc[6].

Meanwhile, when it is determined the broadcast signal does not exist in the channel F[n+1] (S210), the controller 60 selects from memory 70 information pertaining to a next sequentially stored center searching frequency having the next value of n stored in the memory 70, and transmits to the tuner 10 the locking control signal for the searching frequency Fc'[n,n+1].

For example, n for the next stored searching frequency Fc'[n,n+1] may be equal to 11, and the controller 60 selects from memory 70 information pertaining to stored center searching frequency Fc'[11,12] and transmits to the tuner 10 the locking control signal for the searching frequency Fc[11].

When the channel information of the channels F[n] and F[n+1] is completely stored, the controller 60 checks whether or not there is information about the center frequencies of another two channels remaining in the memory 70 (S240). When there is remaining information about the center frequencies in the memory 70, the controller 60 transmits to the tuner 10 the locking control signal for the searching frequency Fc'[n,n+1] according to the next value of n (S250).

When the information about the center frequencies of another two channels is not in the memory 70, the controller 60 finishes the initial searching procedure.

As described above, when channels are initially set in a broadcast system such as a set-top box, a digital TV, or an analog TV, the tuner of the broadcast system determines whether or not a broadcast signal is contained in two channels at one time, and each channel containing a broadcast signal is separately demodulated to obtain information about that channel. Thus, the initial channel setting procedure can be performed quickly and efficiently.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A channel setting method in a broadcast system, comprising:
    setting a center frequency for at least one of a n-th broadcasting channel and (n+1)-th broadcasting channel, and a searching frequency for the n-th and (n+1)-th channels according to the center frequency of the n-th broadcasting channel and the center frequency of the (n+1)-th broadcasting channel;
    obtaining channel information from a broadcast signal received through the n-th channel or the (n+1)-th channel in response to detecting the broadcast signal at the searching frequency; and
    storing the channel information,
    wherein the center frequency of the n-th broadcasting channel is a frequency at a center of a frequency band of the n-th broadcasting channel, and wherein the center frequency of the (n+1)-th broadcasting channel is a frequency at a center of a frequency band of the (n+1)-th broadcasting channel, and
    wherein the searching frequency is a middle frequency between the center frequency of the n-th channel and the center frequency of the (n+1)-th channel.

2. The method of claim 1, further comprising:
    increasing the value of n by 2 to select a next searching frequency; and
    finishing a channel searching procedure when the n-th or (n+1)-th channel corresponding to the selected searching frequency is the last channel.

3. The method of claim 1, wherein the broadcast signal is modulated by at least one of a quadrature amplitude modulation (QAM) technique, an orthogonal frequency division multiplexing (OFDM) technique, and a quadrature phase shift keying (QPSK) technique according to a transmission medium.

4. The method of claim 1, further comprising searching for the broadcast signal, the searching comprising:
    compensating a voltage level of the broadcast signal received at the searching frequency; and
    comparing the compensated voltage level to a previously set voltage level.

5. The method of claim 4, wherein compensating the voltage level is performed by an Automatic Gain Control (AGC) method.

6. A channel setting method in a broadcast system, comprising:
    setting a center frequency for at least one of a n-th broadcasting channel and (n+1)-th broadcasting channel, and a searching frequency of the n-th and (n+1)-th channels according to the center frequency of the n-th broadcasting channel and the center frequency of the (n+1)-th broadcasting channel, the searching frequency being a middle frequency between the center frequency of the n-th channel and the center frequency of the (n+1)-th channel;
    storing the searching frequency in response to detecting a broadcast signal at the searching frequency;
    selecting a next searching frequency; and
    storing channel information obtained from the broadcast signal at the center frequency of the n-th channel or the center frequency of the (n+1)-th channel corresponding to the stored searching frequency when the searching frequency is the last searching frequency,
    wherein the center frequency of the n-th broadcasting channel is a frequency at a center of a frequency band of the n-th broadcasting channel, and wherein the center frequency of the (n+1)-th broadcasting channel is a frequency at a center of a frequency band of the (n+1)-th broadcasting channel.

7. The method of claim 6, wherein the channel information is obtained by demodulating the broadcast signal at the center frequency of the n-th channel or the center frequency of the (n+1)-th channel.

8. The method of claim 6, wherein selecting the next searching frequency comprises setting the searching frequency after increasing the value of n by 2.

9. A broadcast system, comprising:
    a channel searching unit to set a center frequency for at least one of a n-th broadcasting channel and (n+1)-th broadcasting channel, and a searching frequency of the n-th and (n+1)-th channels according to the center frequency of the n-th broadcasting channel and the center frequency of the (n+1)-th broadcasting channel, and to store channel information obtained from a broadcast signal received through the n-th or (n+1)-th channel in response to detecting the broadcast signal at the searching frequency,
    wherein the center frequency of the n-th broadcasting channel is a frequency at a center of a frequency band of the n-th broadcasting channel, and wherein the center frequency of the (n+1)-th broadcasting channel is a frequency at a center of a frequency band of the (n+1)-th broadcasting channel, and
    wherein the searching frequency is a middle frequency between the center frequency of the n-th channel and the center frequency of the (n+1)-th channel.

10. The broadcast system of claim 9, wherein the channel searching unit comprises:

a tuner to convert the broadcast signal received at the searching frequency into an intermediate frequency (IF) signal;

an Automatic Gain Control (AGC) processor to compensate a voltage level of the IF signal; and a controller to compare the voltage level compensated by the AGC processor to a previously set voltage level to determine whether the broadcast signal exists.

11. The broadcast system of claim 10, wherein the controller locks the tuner to the searching frequency and locks the tuner to the center frequency of the n-th or (n+1)-th channel corresponding to the searching frequency when the broadcast signal exists corresponding to the searching frequency.

12. The broadcast system of claim 10, wherein the controller stores the channel information obtained from the center frequency of the n-th or (n+1)-th channel in a memory.

13. The broadcast system of claim 10, wherein the controller sequentially increases the value of n by 2 to select the searching frequency.

14. The broadcast system of claim 10, wherein the broadcast signal is modulated by one of a quadrature amplitude modulation (QAM) technique, an orthogonal frequency division multiplexing (OFDM) technique, and a quadrature phase shift keying (QPSK) technique according to a transmission medium.

15. A channel setting method in a broadcast system, the method comprising:

setting a center frequency for at least one of a n-th broadcasting channel and (n+1)-th broadcasting channel, and a searching frequency of n-th and (n+1)-th channels according to the center frequency of the n-th broadcasting channel and the center frequency of the (n+1)-th broadcasting channel, the searching frequency being a middle frequency between the center frequency of the n-th channel and the center frequency of the (n+1)-th channel;

storing the searching frequency in response to detecting a broadcast signal; and storing channel information obtained from the broadcast signal at the center frequency of the n-th or (n+1)-th channel corresponding to the stored searching frequency when the searching frequency is the last searching frequency, wherein the center frequency of the n-th broadcasting channel is a frequency at a center of a frequency band of the n-th broadcasting channel, and wherein the center frequency of the (n+1)-th broadcasting channel is a frequency at a center of a frequency band of the (n+1)-th broadcasting channel.

* * * * *